US005668476A

United States Patent [19]

Archer

[11] Patent Number: 5,668,476

[45] Date of Patent: Sep. 16, 1997

[54] METHOD OF DETECTING WHEN A MOVING COMPOMENT ATTAINS A FINAL POSITION

[75] Inventor: Michael Anthony Archer, Twickenham, England

[73] Assignee: Lucas Industries public limited company, West Midlands, England

[21] Appl. No.: 620,907

[22] Filed: Mar. 25, 1996

[30] Foreign Application Priority Data

Apr. 8, 1995 [GB] United Kingdom .................. 9507367

[51] Int. Cl.$^6$ .................................................. G01R 31/06

[52] U.S. Cl. .................. 324/546; 324/207.16; 324/418; 361/154

[58] Field of Search .................................. 324/654, 73.1, 324/772, 545, 546, 415, 418, 423, 207.16; 73/168; 340/648, 686, 687; 361/152, 154; 251/129.01

[56] References Cited

U.S. PATENT DOCUMENTS

| | | | |
|---|---|---|---|
| 4,266,261 | 5/1981 | Streit et al. | 361/154 |
| 4,649,341 | 3/1987 | Ulbrich et al. | 324/207.16 |
| 4,859,942 | 8/1989 | Charton et la. | 324/654 X |
| 5,182,517 | 1/1993 | Thelen et al. | 324/418 |
| 5,245,501 | 9/1993 | Locher et al. | 361/154 |
| 5,260,651 | 11/1993 | Tischer et al. | 324/207.16 |
| 5,293,551 | 3/1994 | Perkins et al. | 361/154 |
| 5,481,187 | 1/1996 | Marcott et al. | 324/654 X |

FOREIGN PATENT DOCUMENTS

| | | |
|---|---|---|
| 0242402 | 10/1986 | European Pat. Off. . |
| 0376493 | 11/1989 | European Pat. Off. . |
| 0499419 | 2/1992 | European Pat. Off. . |
| 8705662 | 9/1987 | Germany . |

*Primary Examiner*—Ernest F. Karlsen
*Assistant Examiner*—Diep Do
*Attorney, Agent, or Firm*—Trexler, Bushnell, Giangiorgi & Blackstone, Ltd.

[57] ABSTRACT

A method of detecting when a moving component of an electromagnetically operable device attains a final position after de-energizing a winding of the device comprises allowing the energizing current to fall to zero and prior to the component reaching its final position, connecting a sensing circuit in parallel with the winding, the current flow in the sensing circuit increasing from the instant of connections and decreasing when the component reaches its final position, said sensing circuit detecting the change in current flow.

5 Claims, 1 Drawing Sheet

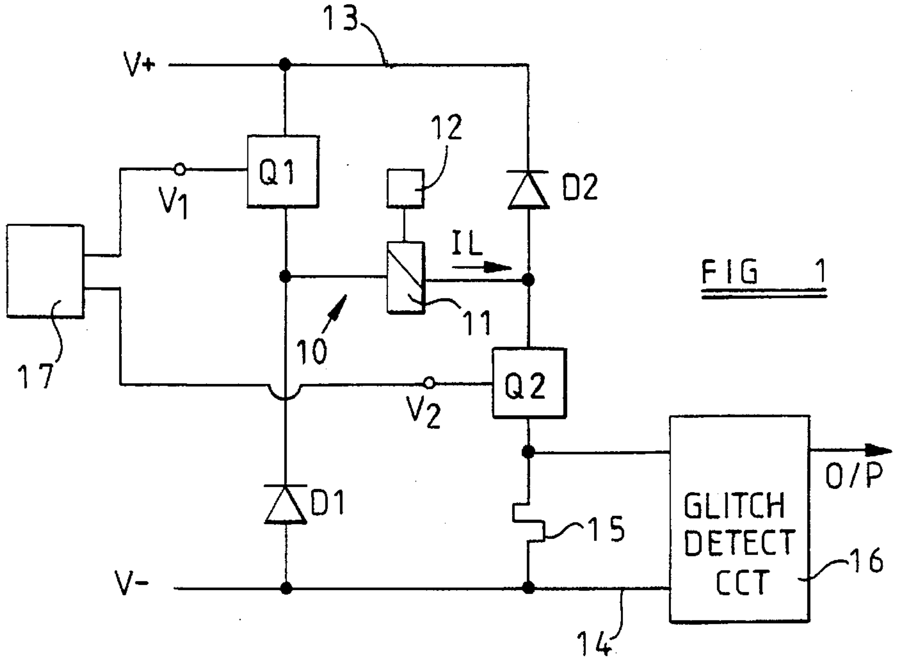
FIG 1
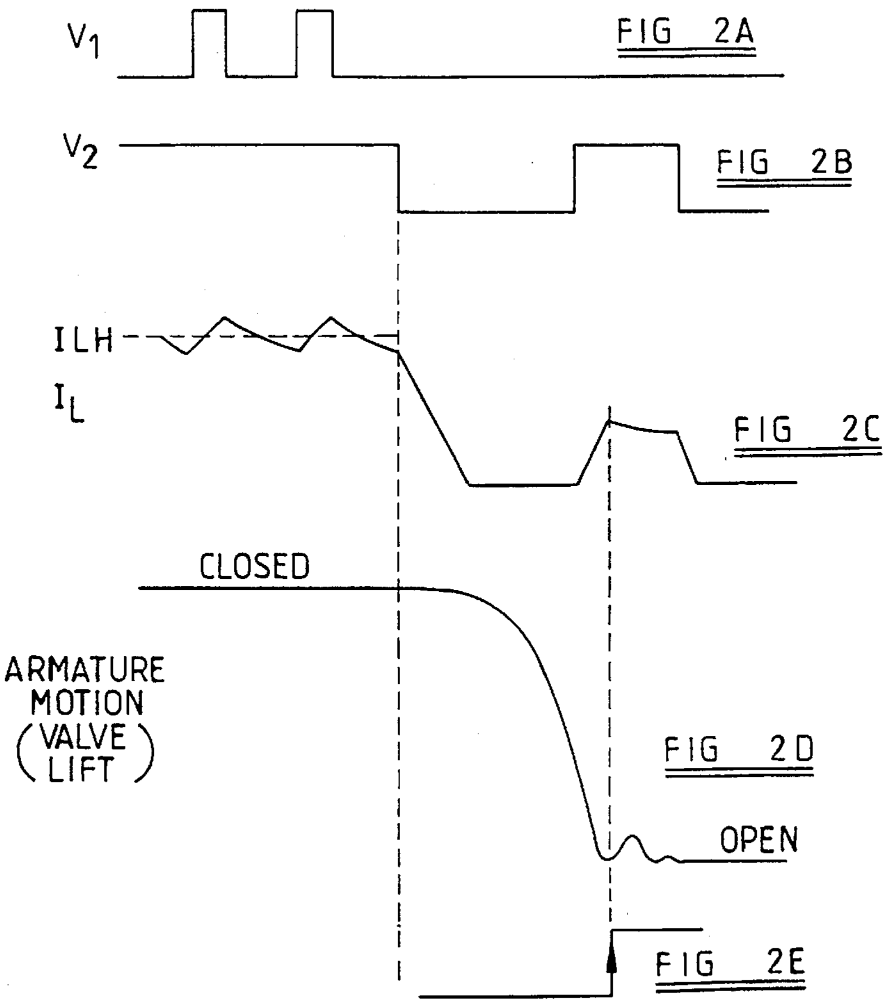
FIG 2A
FIG 2B
FIG 2C
FIG 2D
FIG 2E

METHOD OF DETECTING WHEN A MOVING COMPOMENT ATTAINS A FINAL POSITION

BACKGROUND

This invention relates to a method of detecting when a moving component of an electromagnetically operable device attains a final position after de-energising a winding forming part of the device.

A example of such a device is an electromagnetically operable spill control valve forming part of the fuel system of an internal combustion engine. When the winding is energised the spill control valve member moves to its closed position against the action of a spring. When the winding is de-energised the valve member moves to its open position as determined by a stop, under the action of the spring. For the assessment of the operation of the spill control valve it is useful to have a signal indicative of when the valve member engages the stop.

OBJECT AND SUMMARY

The object of the invention is to provide a method for the purpose specified in a simple and convenient form.

According to the invention a method for the purpose specified comprises allowing the energising current in the winding to fall to zero and prior to the component reaching its final position, connecting in parallel with the winding a sensing circuit through which current can flow, the current in said sensing circuit increasing from the instant of connection and decreasing when the component reaches its final position, and detecting the change in current flow.

BRIEF DESCRIPTION OF THE DRAWINGS

In the accompanying drawings:

FIG. 1 is a circuit diagram showing an electromagnetically operable device and the associated circuit components, FIGS. 2A–2C show the signal waveforms at various points in the circuit, FIG. 2D shows the movement of a component of the device, and FIG. 2E shows an output signal which is obtained from the circuit.

DESCRIPTION

Referring to FIG. 1 of the drawings, an electromagnetically operable device in the form of a spill control valve of an engine fuel injection system, is indicated at 10 and it comprises a winding 11 associated with which is a movable armature which is coupled to a valve member 12. the valve member is spring biased to the open position.

One end of the winding 11 can be connected by means of a switchable device Q1 to a positive supply line 13 and the other end of the winding by means of a switchable device Q2, to a negative supply line 14. A sensing resistor 15 is interposed between the switch Q2 and the supply line 14. The one end of the winding 11 is connected through the cathode anode path of a diode D1 to the supply line 14 and the other end of the winding is connected by way of the anode cathode path of a diode D2 to the supply line 13.

In operation, following energisation of the winding by controlling the operation of the switches Q1 and Q2, a control voltage V1 having a waveform as indicated in FIG. 2A is applied to the switch Q1 and a voltage V2 as shown in FIG. 2B is applied to the switch Q2. The current waveform in the winding is shown in FIG. 2C, the mean current ILH being a holding current required to maintain the valve member 12 in the closed position. The control voltages V1 and V2 are supplied by a logic control circuit 17 which forms part of or receives signals from an engine control system.

When it is required to open the spill valve both switches Q1 and Q2 are opened and the current flowing in the winding 11 falls at a high rate, the current flowing through the diodes D1 and D2 to the supply. The valve member 12 starts to move towards the open position under the action of the spring as shown in FIG. 2D and this movement continues after the current in the winding has fallen to zero. Prior to the valve member being brought to rest, the switch Q2 is re-closed by applying the control voltage V2.

Re-closing the switch Q2 has the surprising effect that a current starts to circulate in the circuit including the winding, the diode D1, the switch Q2 and the resistor 15, the current flow being due to the fact that the winding/armature combination acts as a generator. When the valve member and armature are brought to rest the generator effect ceases and the current starts to decrease and the change in slope of the current waveform can be detected by means of a detector circuit 16 conveniently in the form of a differentiating circuit. FIG. 2C shows the current waveform and FIG. 2E shows the output of the detector circuit.

It will be appreciated that in order for the circuit to work as described, the voltage which is generated by the winding/armature combination must exceed the forward voltage drop of the diode D1. In the situation where the winding has too few turns as may be the case with a winding for a low voltage supply, the detector may be responsive to current flow in a sensing resistor which is connected in parallel with the winding by means of a further switch.

It should also be noted that the action of closing the switch Q2 means that there will be a small retarding force applied to the armature and this may be beneficial in reducing the impact of the valve member and/or the armature on its stop.

I claim:

1. A method of detecting when a moving component of an electromagnetically operable device attains a final position after de-energizing a winding forming part of a device characterized in that the energizing current in said winding is allowed to fall to zero, and prior to said component reaching its final position, a sensing circuit through which current can flow is connected in parallel with said winding, the current in said sensing circuit increasing from the instant of connecting said sensing circuit in parallel with said winding and decreasing when said component reaches its final position, and detecting when said component reaches its final position by detecting the change from increasing current to decreasing current.

2. A method according to claim 1, characterized in that said sensing circuit includes a resistor, a first switch operable to connect said resistor in parallel with said winding and detector circuit responsive to said change in current flow in said winding.

3. A method according to claim 2, characterised in that said detector circuit is a differentiating circuit.

4. A method according to claim 2, characterized in that said resistor and said first switch form a connection between one end of said winding and a first terminal, the other end of said winding being connected to said first terminal by way of a diode which is poled to conduct said current when the first switch is closed.

5. A method according to claim 4, characterized in that said first terminal is one terminal of a source of electric supply, the other terminal of which can be connected to the other end of said winding by way of a second switch, said first switch and said second switch being closed to energize said winding, and a further diode connected between said one end of said winding and said other terminal of the source of supply.

* * * * *